(12) United States Patent
Potkonjak

(10) Patent No.: US 8,427,346 B2
(45) Date of Patent: Apr. 23, 2013

(54) ADAPTIVE COMPRESSION

(75) Inventor: Miodrag Potkonjak, Los Angeles, CA (US)

(73) Assignee: Empire Technology Development LLC, Wilmington, DE (US)

( * ) Notice: Subject to any disclaimer, the term of this patent is extended or adjusted under 35 U.S.C. 154(b) by 0 days.

(21) Appl. No.: 12/996,972

(22) PCT Filed: Apr. 13, 2010

(86) PCT No.: PCT/US2010/030953
§ 371 (c)(1),
(2), (4) Date: Dec. 8, 2010

(87) PCT Pub. No.: WO2011/129818
PCT Pub. Date: Oct. 20, 2011

(65) Prior Publication Data
US 2012/0265737 A1 Oct. 18, 2012

(51) Int. Cl.
*H03M 7/00* (2006.01)
(52) U.S. Cl.
USPC .............................. 341/50; 341/51
(58) Field of Classification Search ........... 341/50, 341/51, 64; 375/240; 382/251; 709/247; 710/68; 702/183
See application file for complete search history.

(56) References Cited

U.S. PATENT DOCUMENTS

| | | | |
|---|---|---|---|
| 4,202,340 A | 5/1980 | Langer et al. | |
| 5,506,916 A | 4/1996 | Nishihara et al. | |
| 7,643,142 B2 | 1/2010 | van den Engh | |
| 7,653,248 B1 | 1/2010 | Witzgall et al. | |
| 2002/0103938 A1 | 8/2002 | Brooks et al. | |
| 2004/0068332 A1 | 4/2004 | Ben-Gal et al. | |
| 2005/0078017 A1 | 4/2005 | Gergely et al. | |
| 2005/0131660 A1 | 6/2005 | Yadegar et al. | |
| 2005/0244069 A1 | 11/2005 | Wang | |
| 2005/0256974 A1 | 11/2005 | Teodosiu et al. | |
| 2006/0063156 A1 | 3/2006 | Willman et al. | |
| 2006/0104526 A1 | 5/2006 | Gringeler et al. | |
| 2006/0129324 A1 | 6/2006 | Rabinoff et al. | |
| 2007/0079223 A1 | 4/2007 | Mondin et al. | |
| 2007/0096954 A1* | 5/2007 | Boldt et al. ............. 341/50 |

(Continued)

FOREIGN PATENT DOCUMENTS

WO WO-2011/129817 10/2011

OTHER PUBLICATIONS

U.S. Appl. No. 12/997,862, Beckmann et al.

(Continued)

*Primary Examiner* — Joseph Lauture
(74) *Attorney, Agent, or Firm* — Perkins Coie LLP

(57) ABSTRACT

Technology for adaptive compression is described ("the technology"). The technology may identify two or more partitions of a data stream; optionally pre-process data in each partition; create one or more evaluation functions to evaluate a suitability for compression of the data in each partition using a set of potential compression methods; process the created one or more evaluation functions; choose a subset of the set of potential compression methods for each segment at least partly by analyzing the evaluation functions; select a compression method for each segment based on a compression ratio of compressing the sequence of used compression methods and a compression rate of the data; compress the data in each partition using the selected compression method for the partition; compress a subsequence that indicates which compression method is used for each segment.

23 Claims, 9 Drawing Sheets

U.S. PATENT DOCUMENTS

| | | | |
|---|---|---|---|
| 2008/0004904 | A1 | 1/2008 | Tran |
| 2008/0187047 | A1 | 8/2008 | Stephan et al. |
| 2009/0069642 | A1 | 3/2009 | Gao et al. |
| 2009/0228299 | A1 | 9/2009 | Kangarloo et al. |
| 2009/0312817 | A1 | 12/2009 | Hogle et al. |
| 2010/0008424 | A1 | 1/2010 | Pace |
| 2010/0046848 | A1 | 2/2010 | Witzgall et al. |
| 2010/0076714 | A1 | 3/2010 | Discenzo |
| 2011/0251986 | A1 | 10/2011 | Potkonjak |
| 2012/0265738 | A1 | 10/2012 | Beckmann et al. |

OTHER PUBLICATIONS

Doukas et al. "Context-Aware Medical Content Adaptation through Semantic Representation and Rules Evaluation," 3rd International Workshop on Semantic Media Adaptation and Personalization, 22 pages, 2008.

International Search Report and Written Opinion; International Application No. PCT/US10/30950; Filed Apr. 13, 2010; Applicant: Empire Technologies Development LLC; Mailed Sep. 23, 2010; 10 pages.

International Search Report for PCT/US2010/030952 filed Apr. 13, 2010; Applicant: Empire Technology Development LLC, mailed Dec. 12, 2011.

International Search Report for PCT/US20101030954 filed Apr. 13, 2010; Applicant: Empire Technology Development, LLC; mailed Aug. 25, 2010.

Sahay et al. "Semantic Annotation and Inference for Medical Knowledge Discovery," NSF Symposium on Next Generation of Data Mining(NGDM), Baltimore, NSF Symposium Proceedings, 2007.

Allen Gersho, Robert M. Gray, Vector quantization and signal compression, Kluwer Academic Publishers, Norwell, MA, 1991.

David S. Taubman, Michael W. Marcellin, JPEG 2000: Image Compression Fundamentals, Standards and Practice, Kluwer Academic Publishers, Norwell, MA, 2001.

Rissanen, J. 1976. Generalised Kraft inequality and arithmetic coding. IBM J. Res. Dev. 20, 198-203.

Ian H. Witten, Radford M. Neal, John G. Cleary, Arithmetic coding for data compression, Communications of the ACM, v.30 n. 6, p. 520-540, Jun. 1987.

Timothy C. Bell, John G. Cleary, Ian H. Witten, Text compression, Prentice-Hall, Inc., Upper Saddle River, NJ, 1990.

Ian H. Witten, Alistair Moffat, Timothy C. Bell, Managing gigabytes (2nd ed.): compressing and indexing documents and images, Morgan Kaufmann Publishers Inc., San Francisco, CA, 1999.

Zhen Zhang and V. Wei, "An on-line universal lossy data compression algorithm via continuous codebook refinement. I. Basic results," Information Theory, IEEE Transactions on, vol. 42, 1996, pp. 803-821.

Didier Le Gall, "MPEG: A Video Compression Standard for Multimedia Applications," Communications of the ACM, V. 34 n. 4, Apr. 1991, pp. 46-58.

Huffman, David A., "A Method for the Construction of Minimum-Redundancy Codes," Proceedings of the I.R.E, 40, 9, Sep., 1098-1101.

Shapiro, J., "Embedded Image Coding Using Zerotrees of Wavelet Coefficients," IEEE Transactions on Signal Processing, vol. 41, No. 12, Dec. 1993, 18 pages.

Wallace, Gregory K., "The JPEG Still Picture Compression Standard," Digital Equipment Corporation, Maynard, Massachusetts, Dec. 1991, 17 pages.

Ziv et al., "A Universal Algorithm for Sequential Data Compression," IEEE Transactions on Information Theory, vol. IT-23, No. 3, May 1977, 7 pages.

U.S. Appl. No. 13/519,309, filed Oct. 15, 2012, Potkonjak.

"Electronic Implants that Dispense Medicines Via Wireless Medical Network are on the Horizon," Feb. 6, 2009, azonano.com news.

Anderson et al, "Shakra: tracking and sharing daily activity levels with unaugmented mobile phones," Mobile Networks and Applications, v.12 n. 2-3, pp. 185-199, Mar. 2007.

Bai, X., et al., "Segmentation-Based Multilayer Diagnosis Lossless Medical Image Compression," Reproduction, 2006, vol. 36, pp. 9-14.

Consolvo, Sunny et al., "Design requirements for technologies that encourage physical activity," Proceedings of the SIGCHI conference on Human Factors in computing systems, Apr. 2006.

Danninger et al., "The connector: facilitating context-aware communication," Proceedings of the 7th Int'l conference on Multimodal Interfaces, Oct. 2005.

Driver, Cormac and Siobhan Clarke, "An application framework for mobile, context-aware trails," Pervasive and Mobile Computing, v.4 n. 5, pp. 719-736, Oct. 2008.

Gallager, R., "Variations on a theme by Huffman," IEEE Transactions on Information Theory, vol. IT-24, No. 6, Nov. 1978, 7 pages.

Hand, E., "Head in the clouds," Nature, vol. 449, Oct. 24, 2007, p. 963.

Harrison, Chris et al., "Lightweight material detection for placement-aware mobile computing," Proceedings of Acm symposium on User interface software and technology, Oct. 2008.

Hayes, Brian, "Cloud computing," Communications of the ACM, v.51 n. 7, Jul. 2008.

Huffman, D.A. "A method for the construction of minimum-redundancy codes," 1952, Proc. Inst. Radio Eng. 40, 9 (Sep.), 1098-1101.

International Search Report and Written Opinion; International Application No. PCT/US10/30953; Filed Apr. 13, 2010; Applicant: Empire Technologies Development LLC; Mailed Aug. 4, 2010; 11 pages.

Iso et al., "Gait analyzer based on a cell phone with a single three-axis accelerometer," Proceedings of the 8th conference on Human-computer interaction with mobile devices and services, Sep. 2006.

Istepanian, R.S.H. and S. Laxminaryan, "UNWIRED, the next generation o•wireless and internetable telemedicine systems-editorial paper," IEEE Trans. Inform. Technol. Biomed., vol. 4, pp. 189-194, Sep. 2000.

Jovanov, E. et al., "Stress monitoring using a distributed wireless intelligent sensor system," IEEE Eng. Med. Biol. Mag., vol. 22, No. 3, pp. 49-55, May/Jun. 2003.

Kanefsky, M. & C-B Fong, "Predictive source coding techniques using maximum likelihood prediction for compression of digitized images," IEEE Transactions on Information Theory, vol. 30, Issue 5, pp. 722-727, Sep. 1984.

Khalil et al., "Context-aware telephony: privacy preferences and sharing patterns," Proceedings of the conference on Computer supported cooperative work, Nov. 2006.

Korhonen, I. et al., "Health monitoring in the home of the future," IEEE Eng. Med. Biol. Mag., vol. 22, No. 3, pp. 66-73, May/Jun. 2003.

Kurdi, Heba et al., "A Classification of Emerging and Traditional Grid Systems," IEEE Distributed Systems Online, v.9 n. 3, p. 1, Mar. 2008.

Le Gall, Didier, "MPEG: a video compression standard for multimedia applications," Communications of the ACM, v.34 n. 4, p. 46-58, Apr. 1991.

Lederer, Scott et al., "Personal privacy through understanding and action: five pitfalls for designers," Personal and Ubiquitous Computing, v.8 n. 6, pp. 440-454, Nov. 2004.

Ogiela, M.R., and Tadeusiewicz, R., "Nonlinear Processing and Semantic Content Analysis in Medical Imaging—A Cognitive Approach," IEEE Transactions on Instrumentation and Measurement, 2005, vol. 54, Issue: 6, pp. 2149-2155.

Park, S. and S. Jayaraman, "Enhancing the quality of life through wearable technology," IEEE Eng. Med. Biol. Mag., vol. 22, No. 3, pp. 41-48, May/Jun. 2003.

Pattichis, C. S. et al., "Wireless telemedicine systems: An overview," IEEE Antennas Propagat. Mag., vol. 44, No. 2, pp. 143-153, Apr. 2002.

Robison, S., "A Bright Future in the Cloud," Financial Times, Mar. 4, 2008.

Rochwerger, B. et al., "The reservoir model and architecture for open federated cloud computing," IBM Systems Journal, vol. 53, No. 4, 2009.

Shapiro, J. "Embedded Image-Coding using Zerotrees of Wavelet Coefficients," IEEE Trans. Signal Processing, 1993, pp. 3445-3462.

Siewiorek et al., "A Context-Aware Mobile Phone," Proceedings of the 7th IEEE Int'l Symposium on Wearable Computers, pp. 248-249, 2003.

Stanford, V., "Using pervasive computing to deliver elder care," IEEE Pervasive Computing, vol. 1, pp. 10-13, Jan./Mar. 2002.

Valdastri, P. et al, "An implantable telemetry platform system for in vivo monitoring of physiological parameters," IEEE Trans. Inform. Technol. Biomed., vol. 8, No. 3, pp. 271-278, Sep. 2004.

Wallace, Gregory K., "The JPEG still picture compression standard," Communications of the Acm, v.34 n. 4, p. 30-44, Apr. 1991.

Ziv, J. and Lempel, A., "A universal algorithm for sequential data compression," IEEE Transactions on Information Theory, vol. IT-23 No. 3, May 1977, 7 pages.

* cited by examiner

ADAPTIVE COMPRESSION

CROSS-REFERENCE TO RELATED APPLICATIONS

This application is a U.S. National Stage application of International Application No. PCT/US2010/030953, filed on Apr. 13, 2010, entitled "ADAPTIVE COMPRESSION," which is related to U.S. patent application Ser. No. 12/966,010, filed on Dec. 2, 2010, entitled "COMBINED-MODEL DATA COMPRESSION," all of which are incorporated herein by reference in their entireties.

BACKGROUND

Many fields of human endeavor now use computing devices. Some of these fields collect and process vast amounts of data. As an example, collected medical data can grow exponentially. A medical facility may attach several sensors to a patient, e.g., heart rate monitor, blood pressure monitor, electrocardiograph (EKG) monitor, blood content monitor, urine analysis monitor, brain activity monitor, various other electrodes, etc. When samples are taken from these sensors at a high frequency, the data storage requirements can become immense.

In the field of telemedicine, a surgeon or physician may operate on or interact with a patient who is located at a distance, e.g., many miles away. To properly operate on or diagnose the patient, the surgeon or physician may need nearly real-time access to the remotely collected data. However, network bandwidth may be insufficient to communicate all of the collected data rapidly from the patient sensors to the physician's computing device.

Some of the collected data can require many thousands of terabytes of data storage space, if not more. It is now commonplace for even home computer users to purchase hard disk drives for personal computing devices that provide a storage capacity of 1 terabyte or more. To reduce the amount of storage space that is needed to store data, various compression methods exist.

Compression methods use a fewer number of bits to store data than the number of bits that represent the uncompressed data. Compressed data can thus require less storage space to store and reduced network bandwidth to transmit the compressed data as compared to the equivalent data prior to compression ("uncompressed data").

Compression methods can be lossy or lossless. When a lossy compression method is used to compress data, the compressed data generally cannot be used during expansion to reproduce the originally compressed data with complete fidelity. In contrast, when a lossless compression method is used to compress data, the compressed data can be used to reproduce the originally compressed data with complete fidelity.

Different compression methods are more efficient at compressing different data. Two commonly-employed compression methods are symbol-based compression method and run-length encoding ("RLE") compression method. The symbol-based compression method uses a symbol (e.g., a sequence of bits) to represent a large sequence of bits of data. For example, the symbol "1" can represent "140/90" and the symbol "2" can represent "120/80," which are two common values for blood pressure readings. When compressing a large set of medical data, "140/90" and "120/80" may occur frequently. The symbol-based compression method may substitute "1" whenever "140/90" occurs or "2" whenever "120/80" occurs.

In contrast, the RLE compression method may be more efficient for compressing data when the data includes long sequences of identical values. As an example, when a set of data that is to be compressed includes the values "11111111122222," which may be a sequence of periodic readings from a sensor, the RLE compression method may substitute this set of data with "9152" because there are nine "1"s and then five "2"s in the data. However, the RLE compression method may be less efficient than a symbol-based compression method when the data values fluctuate rapidly.

Even among various symbol-based compression methods, the selection of symbols can affect compression performance. In the example of symbol-based compression provided above for blood pressure readings, the data would not be compressed well if a patient's blood pressure readings rarely contained the values "140/90" or "120/80" and there were no symbols defined for other values.

SUMMARY

Technology for adaptive compression is described ("the technology"). The technology may identify two or more partitions of a data stream; optionally pre-process data in each partition; create one or more evaluation functions to evaluate a suitability for compression of the data in each partition using a set of potential compression methods; process the created one or more evaluation functions; choose a subset of the set of potential compression methods for each segment at least partly by analyzing the evaluation functions; select a compression method for each segment based on a compression ratio of compressing the sequence of used compression methods and a compression rate of the data; compress the data in each partition using the selected compression method for the partition; compress a subsequence that indicates which compression method is used for each segment.

DETAILED DESCRIPTION

Figure 1:
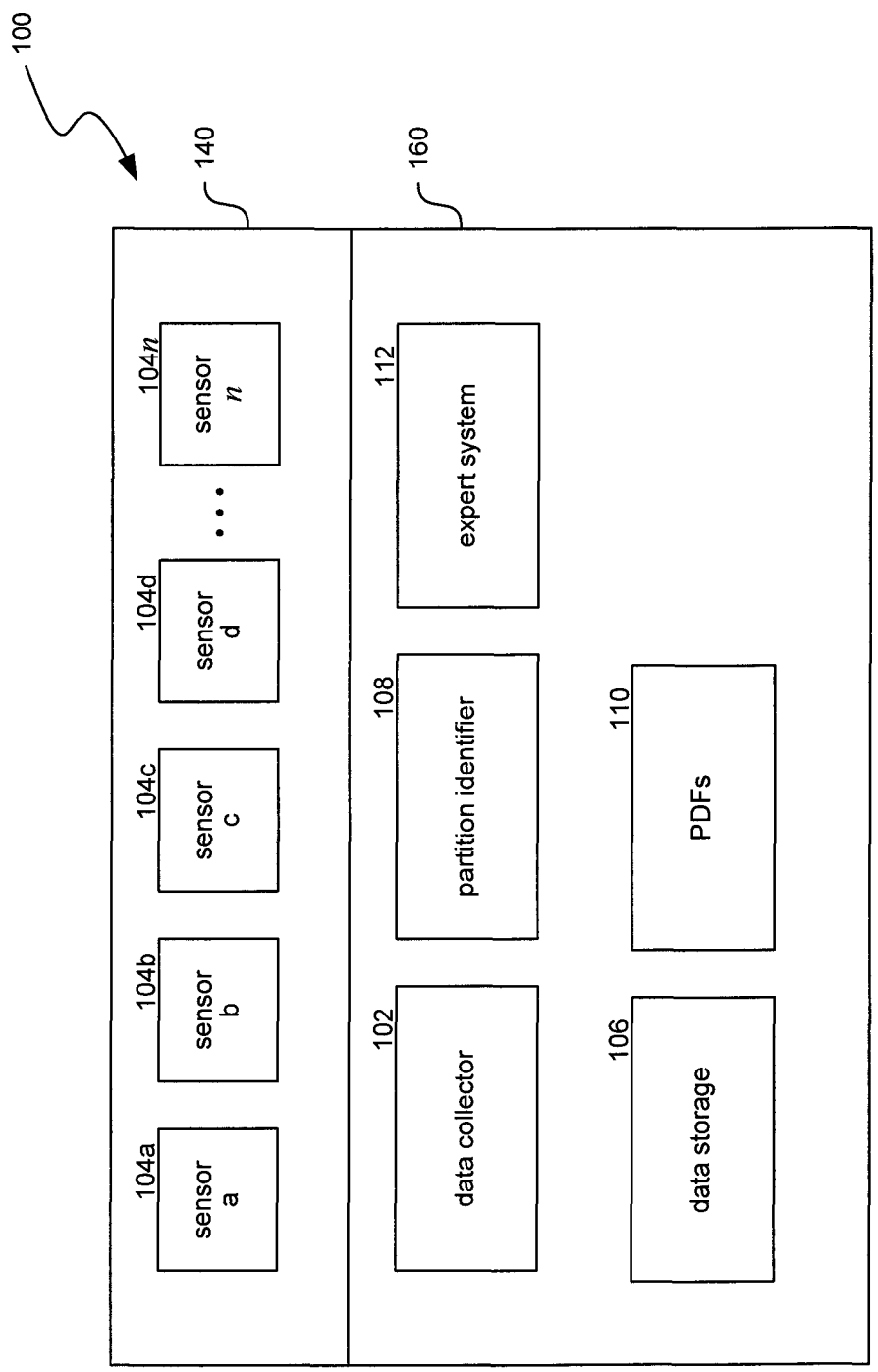
FIG. 1 is a block diagram illustrating an environment in which an adaptive compression technology may operate in some embodiments.

Technology for adaptive compression is described ("the technology"). In various embodiments, the described technology partitions a single signal (e.g., stream of data received from a sensor or other data source) into two or more segments (e.g., "partitions") and selects an optimal compression method for each partition. The compressed sequence can include information indicating which compression scheme is used for each segment and compressed data.

In various embodiments, the technology can be applied simultaneously on two or more data streams; include pre-processing of individual signals to make them more suitable for compression; use one or more statistical functions to characterize data in each partition; process each created statistical function to improve the accuracy of selecting the best compression technique; select a compression technique for each partition; and compress the data using the selected statistical functions.

In some embodiments, the technology employs dynamic programming techniques to select an effective sequence of compression techniques for each segment of the data. The technology can be applied for compression of multiple data streams using a variety of compression techniques.

Various sensors are often used to collect data, e.g., medical data from patients. The signals from these sensors can be either collected digitally or converted to digital numeric form, e.g., by using an analog-to-digital converter. The collected data can then be stored, such as by a computing device. Semantic awareness of the data can be beneficial in improving the analysis and/or compression of this data. Three observations are provided herein, but various embodiments of the disclosed technology may be capable of operating whether or not one or more of these observations hold true for any particular patient. (I) Data can have a level of similarity that makes it possible to treat different values as equivalent values. As an example, it may be beneficial to know that two values (e.g., 120 and 121 for the systolic portion of a blood pressure reading) are so similar that no meaningful difference exists between the two. Thus, a common symbol can be used during compression to represent both 120 and 121. (II) The collected data may also have a high correlation between the sensed values. As an example, as the temperature of a patient or the ambient temperature changes, the systolic portion of a blood pressure reading of the patient may also change in a predictable manner. When multiple sensors are applied to a patient, values collected from the sensors may thus be correlated, e.g., based on the patent's medical condition. The data (and/or predicted data) from any two sensors may be asymmetric, and so deciding the relative order in which sensed signals are mutually predicted and compressed as well as how much to relatively shift each signal can greatly improve compression ratios or preservation of important features ("feature preservation characteristics") of the initial signals. (III) Because the sensed data are the result of physical, chemical, and biological phenomena, they may not occur randomly. As an example, it is rare for a patient's blood pressure or temperature to jump randomly. Indeed, it is more likely for there to be gradual changes. Such signals may be more easily capable of prediction (and therefore optimized compression) if the phenomena are at least partially understood and characterized. As an example, consider sensors deployed in an athletic device, such as a shoe. There are three natural phases for an athlete when walking, running, or jumping: taking off, landing, and airborne. When taking off and landing, the pressure on sensors decrease or increase, respectively. In such cases, delta compression techniques may perform well. When airborne, the pressure is zero on all sensors and therefore run-length encoding or other compression technique that records only non-zero (or zero) samples may be superior.

Many signals (e.g., from sensors) have naturally distinctive time segments. Each segment can be defined by its unique properties of data that can be used for efficient compression. The segments with the same properties may be interleaved in periodic or non-periodic ways. For example, heart signals are mainly periodic, whereas shoe pressure patterns are often aperiodic because the subject may walk, run, jump, dance, sit, etc.

The technology may employ a concept of adaptivity for improving the effectiveness of consequent compression on several levels of abstraction including: (i) the length of each segment where the same compression scheme is applied; (ii) which pre-processing to apply to each segment; (iii) which compression schemes should be considered; (iv) how to encode switching from one compression scheme to another; (v) how to exploit using adaptivity the correlations in a set of signals; (vi) how to use location information where data is collected; (vii) how to use time at which data is collected.

In some embodiments, the technology switches compression techniques for a given segment depending on the pattern and/or statistical characteristics of the data segment. The technology may employ statistical techniques such as regression and smoothing to improve the compression rate. The main optimization contribution is a dynamic programming-based optimization procedure for off-line and real-time adaptive segment compression.

The technology conducts overall adaptive compression of a single stream by employing two interleaved sequences. A first sequence indicates which compression technique is used for a given segment. A second sequence has compressed signal data. The first sequence can also be compressed using an adaptive or some other compression technique. In some embodiments, all segments have the same length.

The technology employs dynamic programming to organize overall adaptive compression. The technology maps the problem into a graph theoretic domain. Each node of the graph corresponds to a segment and has as its weight the number of characters required. Each edge has as its cost the cost of encoding the used compression technique. The shortest path from a node (e.g., "source") that has outgoing edges to each node for this first segment to the destination that has all incoming edges from the nodes that correspond to the last segment is identified as the "best" solution.

To identify the boundaries of each segment, the technology can employ in some embodiments constant lengths. Alternatively, the technology may employ relatively short segments and, on a continual basis, merge segments that use the same compression technique.

To update statistical models for each segment, the technology may employ in various embodiments different techniques, e.g., sliding windows with a specified weight function, keep data from several sliding windows and repeatedly send indication of which window is used. The sliding window technique may be well suited for less predictable data and longer segments.

To conduct overall adaptive compression of several streams, the technology may again partition each signal into a number of segments. In some embodiments, the lengths of the periods have small least common multiplier (LCM). The technology may compress each signal in a segment either separately or using already compressed simultaneous segments of other correlated signals. The technology may employ dynamic programming techniques to find an optimal selection of compression techniques for each segment of each signal. In this case, for each signal, the technology may be able to derive prediction from already compressed signals. In some embodiments, the technology may first compress the best predictors as indicated by lower entropy of mutual probability mass functions ("PMFs") of the predicted signals with respect to the PMF of the pertinent PMF of the predicted signal.

In various embodiments, the technology applies digital signal processing, statistical techniques, and information theory techniques in a coordinated manner to adaptively partition data and compress the partitioned data. In various embodiments, the technology can partition data based on data values or trends. As an example, when data values rapidly increase during a first time period and then decrease during a second time period, the technology can create two partitions of the data. The technology can then identify one or more compression methods (e.g., symbol-based compression methods) to each partition. The technology can then determine a set of symbols for each identified symbol-based compression method, and apply or determine a statistical function probability distribution function ("PDF") or other statistical function for each partition. The PDF can indicate a probability that each symbol is used to compress the data. In various embodiments, the technology can employ pattern recognition techniques to identify the compression methods. While the disclosed embodiments may use PDFs, one skilled in the art will recognize that other statistical functions can also be used.

In various embodiments, the technology can improve the applied compression methods by iteratively updating the PDFs. As an example, the PDFs can be updated based on newly received data or entropy trends. Entropy trends can be a measure of how rapidly data values are fluctuating.

In various embodiments, the technology can optimize compression rates by optimizing the application of short encodings (e.g., symbols with fewer bits). Some PDFs will be more commonly applied to compress data than other PDFs because of the underlying data values. The technology can use short encodings to encode symbols associated with a more commonly applied PDF than a less commonly applied PDF.

In some embodiments, the technology can employ various smoothing techniques (e.g., entropy or smoothing techniques) so that minor fluctuations within a broader trend do not cause identification of very small windows of data for the partitions. As an example, when data values have a generally increasing trend when viewed in large time windows (e.g., minute to minute), there may be minor fluctuations when viewed in small time windows (e.g., from second to second). The technology is capable of employing the smoothing techniques to identify trends in the data.

The technology can use streaming dynamic programming algorithms (e.g., "Viterbi" algorithms that are known in the art) to dynamically allocate PDFs. The dynamic programming algorithms may dynamically allocate PDFs based on the trends in the data, e.g., entropy trends.

When the data is non-ergodic (e.g., every data sample is equally important), selection of appropriate data-compression methods can be improved by use of the technology disclosed herein. Moreover, the technology can be applied to compress data in various fields that produce or employ large quantities of data, including, e.g., telemedicine.

In various embodiments, the technology can partition data; create PDFs for each of the partitions; smooth the PDFs; identify a principal PDF; evaluate joint PDFs; select a principal joint PDF; estimate compression rates for each of the PDFs or joint PDFs; and select the optimal sequence of PDFs. In some embodiments, the technology may employ a small number of unique PDFs by using regression techniques to identify "robust" PDFs that are not overfilled to a small set of data.

In various embodiments, the technology can compress single and multiple correlated signals using an adaptive procedure that includes: (i) pre-processing individual signals individually or jointly to make them suitable for compression by decreasing individual or joint entropy; (ii) creating individual or joint PDFs considering a user-specified number of recent symbols; (iii) processing PDFs obtained using windows of user specified symbols in such a way that processed PDFs are more robust against faulty or missing measurements; (iv) selecting PDFs that will be initially or consequently used for compression; (v) characterizing selected subsets of PDFs in terms of properties, e.g., prediction accuracy, entropy, mutual entropy, PDF monotonicity, and/or moving average autocorrelation and cross-correlation; (vi) combining these properties into a single number or vector using statistical classification procedures; (vii) creating windows (e.g., partitions) of size and weight models that characterize change in prediction precision as a function of the window size and using a specific weight model; (viii) creating transition probability models from one type of window PDF to another type of window PDF; (ix) selecting an optimal current window and corresponding PDF for compression of individual or all signals using dynamic programming or statistical modeling techniques; (x) compressing signals using coordinated quantization and encoding; (xi) post-processing signals and their compressed version for compression or additional compression using traditional compression techniques; and (xii) updating window properties, window PDFs, and models for transition from one PDF to another PDF.

In some embodiments, the technology pre-processes signals using a current or anticipated trend window individual or joint PDFs so that resulting signals are more amenable for a high level of compression. The technology can apply various differential compression techniques, apply simple linear transformations, e.g., discrete cosine transformations, or other more complex techniques.

In some embodiments, the technology can create initial windows that are used for accumulation of information for development of individual or joint PDFs. As an example, the technology can conduct multiple binary searches over window sizes and use initial weight functions that perform well on a particular type of signals.

In some embodiments, the technology can process individual or joint PDFs to make them robust with respect to outlier data, faults, large error measurements, or missing data. As an example, the technology can employ nonparametric statistical techniques, e.g., local polynomial regressions and various kernel smoothing approaches.

In some embodiments, the technology characterizes individual and joint PDFs using measures such as recent prediction accuracy, entropy, mutual entropy, PDF monotonicity, and/or moving average autocorrelation and cross-correlation. The technology can combine individual measures into a number that can be employed to determine when to switch compression methods, e.g., using maximum likelihood or statistical models procedures such as CART (classification and regression trees), multivariate adaptive regression (MARS), or nearest neighbor classification.

In some embodiments, the technology selects PDFs for tracking and potential use using dynamic programming. The types of PDFs that have paths with minimal scores (e.g., minimal best path) can be eliminated from further consideration. In some embodiments, a user can set the number of paths that are eliminated. In some embodiments, new PDFs can be included from second tier PDF candidates guided by the decision policy number described above that can be employed to determine when to switch compression methods.

In some embodiments, the technology selects PDFs for tracking and potential use using statistical techniques. The analysis of recent properties of signal in the current window can be used to select the PDFs that are most beneficial for compression according to their performances on previous signals with similar properties.

In some embodiments, the technology determines window size and weight models used for recent PDFs. The analysis of recent properties of the signal for the current window is used to select the PDFs that are most beneficial for compression according to their performances on previous signals with similar properties. The signal properties include signal variance, covariance, correlations, monotonicity, and convexity.

In some embodiments, the technology creates transition probability models between two types of PDFs using parametric and nonparametric statistical techniques.

In some embodiments, the technology determines using dynamic programming techniques which transition probability models should be generated by computing which of the existing models are used most often.

In some embodiments, the technology compresses symbols of the data stream detected from sensors using quantization and encoding. Quantization of signals can be conducted in such a way that symbols that differ by at most a user specified limit are merged into a single symbol. Encoding is conducted in such a way that most common symbols are assigned shortest codes. In some embodiments, the two optimizations are done simultaneously.

In some embodiments, the technology post-processes compression. As an example, the technology can apply various differential compression methods, apply simple linear transformations such as discrete cosine transformation (DCT), or other complex techniques.

In some embodiments, the technology can update recently used PDFs by sampling already created PDFs and employing new signals accordingly.

In some embodiments, the technology updates all or a subset of used models using incremental change techniques.

Figure 9:
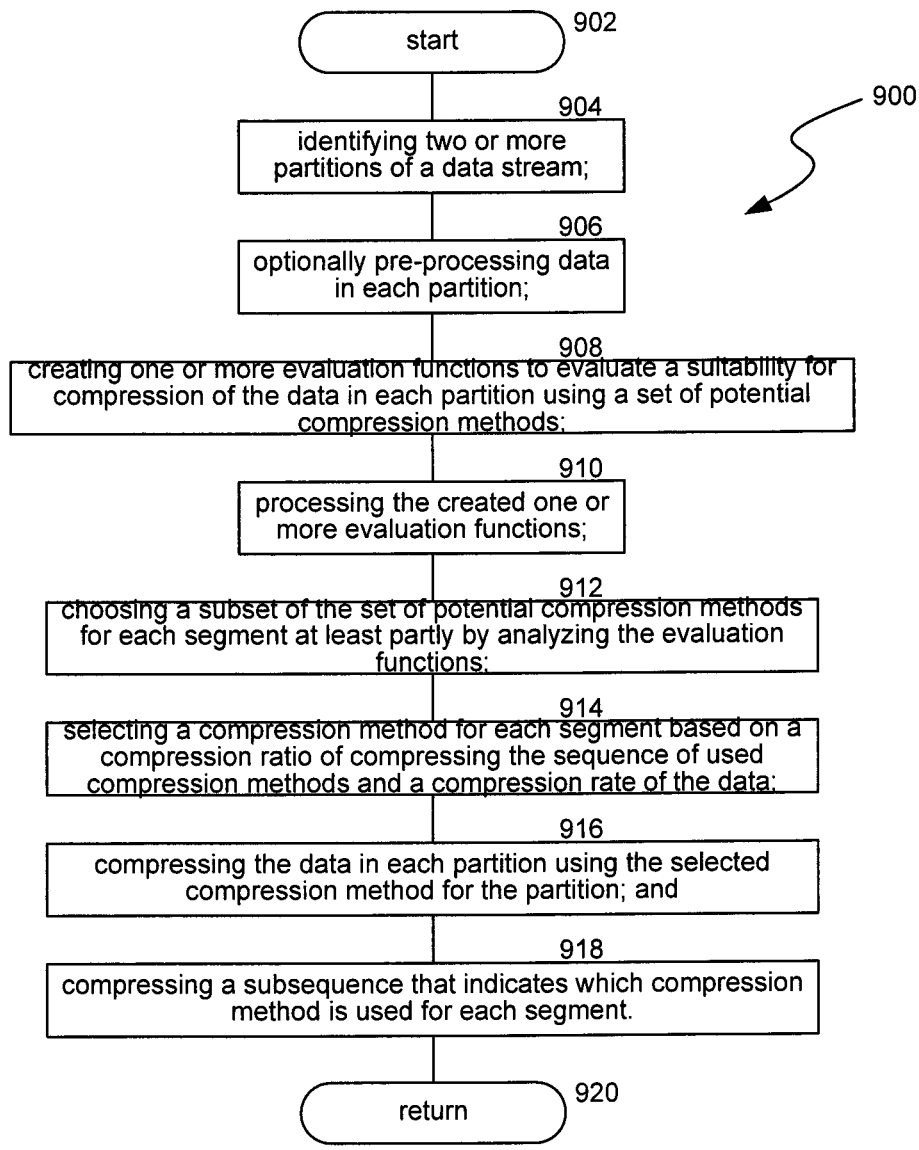
FIG. 9 is a flow diagram illustrating a routine invoked by the technology in some embodiments.
Figure 8:
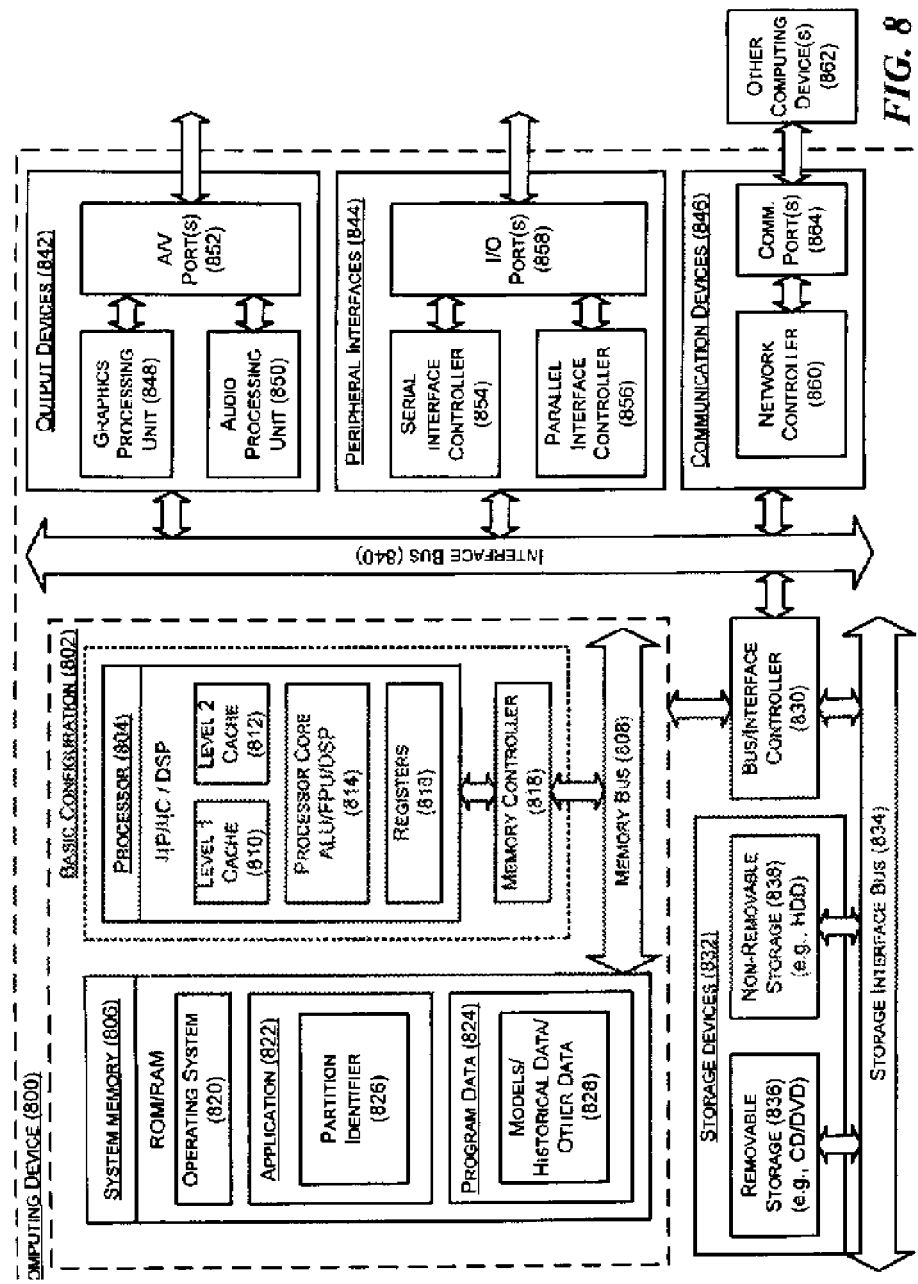

In various embodiments, the technology implements (see, e.g., FIG. 9) a method 900 for identifying two or more partitions of a data stream 904; optionally pre-processing data in each partition 906; creating one or more evaluation functions to evaluate a suitability for compression of the data in each partition using a set of potential compression methods 908; processing the created one or more evaluation functions 910; choosing a subset of the set of potential compression methods for each segment at least partly by analyzing the evaluation functions 912; selecting a compression method for each segment based on a compression ratio of compressing the sequence of used compression methods and a compression rate of the data 914; compressing the data in each partition using the selected compression method for the partition 916; and compressing a subsequence that indicates which compression method is used for each segment 918. The identifying can include setting all partitions to have an equal length, and in some embodiments the length can be set using a binary search for a highest compression ratio. The pre-processing can include using delta modeling, transformation in another domain using linear transformation, or application of any other compression method, whether lossy or lossless. The technology may characterize selected subsets based on their suitability for high rate compression is performed using probability distribution functions (PDFs) of single or multiple consecutive characters. The technology may evaluate suitability for compression of data in each partition is at least one of an entropy, a mutual entropy, a PDF monotonicity, or a moving average of autocorrelation. Processing the created one or more evaluation functions can include employing parametric or nonparametric statistical techniques such as smoothing or regression. Processing the created one or more evaluation functions may be conducted using re-sampling or boosting statistical techniques, or other machine learning technique. Choosing compression methods can include identifying compression techniques that had a highest score according to processed evaluation functions. Selecting the compression method for each segment may be performed using dynamic programming to minimize the overall compression rate. Compression of each partition may be conducted using a compression method such as run-length encoding, dictionary coders, entropy encoding, arithmetic coding, discrete cosine transform, wavelet compression, linear predictive coding or a compression method that employs statistically processed prediction models. Compression of each partition may be conducted using a lossless compression method such as run-length encoding, dictionary coders, entropy encoding, arithmetic coding, or universal codes. In some embodiments, the data may be compressed on-line with at most a latency "L," and prediction models can be used to predict a most likely most beneficial or average most beneficial compression technique for each segment. The technology may employ dynamic programming with latency L to calculate a most beneficial selection of a compression method for a specified number of segments that are completed at most L time units earlier. The technology may employ information from a global positioning system, some other location discovery system, a clock, a speedometer, or some other type of sensor to adaptively select a compression technique for a selected partition.

The technology may have a computer-readable storage medium storing computer-executable instructions that, when executed, perform a method for compressing multiple streams of data, comprising: identifying two or more partitions of each of two or more signals; optionally pre-processing one or more signals to make it more suitable for high rate of compression; creating one or more evaluation functions to evaluate a suitability for compression of the data in each partition using a set of potential compression methods wherein some of the functions are defined over two or more signals; processing the created evaluation functions; choosing a subset of the set of potential compression methods for each segment of each signal at least partly by analyzing the evaluation functions; selecting a compression method for each segment of each signal based on a compression ratio for compressing the sequence of used compression methods and a compression rate of the data; and compressing the data in each partition of all signals using the selected compression method. The partitions may be of the same or different lengths for different signals. The length of partitions may have a small least common multiplier. The technology may pre-process by time-shifting different signals mutually relative to each other. Selecting a compression method for each segment of each signal may include employing joint PDFs information. The compression may be performed using linear combinations of the considered signals.

Many sensors and wireless network signals can show segments of data with sharply different and repeatable PDFs and joint PDFs. By recognizing when a particular individual or joint PDF or native or processed signal is most suitable for facilitating high rate compression, overall compression can be improved. The technology may find commonly used PDFs, encode each of them using codes where commonly used PDFs have short encodings and send interleaved codes for PDFs and actually compressed signals. Lossy compression of numerical data can be addressed using adaptive quantization where the signals that are within the maximal allowed difference (error) may be merged together. The merging can be done optimally using a polynomial time dynamic programming algorithm. The technology may start the merging from the smallest value and keep information about optimal merging until a specified value. The already best feasible value from the previous "k" values (under the assumption that maximal allowed error is k units) can be used for calculating the current best possible error. To be efficient, a small number of unique PDFs can be employed. Each PDF should be robust, meaning that it is not "overfitted" to a small set of data. The technology may create robust PDFs using regression techniques wherein the explanatory variable may be the numeric value of the sensed signal. The technology may employ one of the following statistical regression techniques: linear regression, polynomial regression; logistic regression, neural networks, kernel density estimation, splines, wavelets, probit regression, ordered logic regression, isotonic regression, generalized linear models, etc. The technology may update unprocessed PDFs. To minimize the expense of smoothing PDFs, the technology may minimize the frequency of the PDF smoothing steps. There is potentially a large number of PDFs that correspond to the data segments of different length. There is also potentially a large number of joint PDFs. There is also a very large number of potential time-shifted joint PDFs. In fact, there may be an exponential number of PDFs in each of these categories. Therefore, in order to reduce the computational effort and the required storage, the technology may use only a subset of PDFs of limited cardinality. It first selects all PDFs for individual signals. For each time signal it selects two or more PDFs only if they are according to a specified criteria that is significantly different. For example, the criteria can be defined as $L_1$ or $L_2$ measure differences. In the next step, the technology computes all joint PDFs where one signal depends on exactly one other signal. The technology may employ dynamic programming (DP) techniques for selecting the optimal sequence of compression steps. The sequence of compression steps may comprise pairs of compressed signals: one for the used compression method that is a function of the used PDF and the other for the compressed sequence itself. After the partitioning, we have for each segment k choices for using a particular PDF and $k_j$ for using a particular compression scheme. Any time the compression method is changed, the technology records additional information about the change of the used compression method. The DP operates in the following way. It first attempts all of the selected options for each signal separately for their first segments. After that, it finds the cumulative first and second segment by using the combination that has the overall smallest cost including possible overhead due to a need for switching the compression scheme. The best result is memorized for PDFs considered in the second scheme. The procedure is iteratively continued by calculating all best compression sequences for segment i+1 using the best sequence for segment i and cumulative cost. Once the end of the time signal is accomplished or when only a single path through the options until step k still has to be considered, the technology finds the best sequence of the compression steps by backtracking from the best solution at the current step through previous solutions that are used to find the best solution. As mentioned, the technology employs DP to predict a high quality sequence of used compression methods. In many scenarios, online (e.g., real-time) compression is required. In these cases, the technology may precalculate the sequence of used compression methods for each segment. The technology calculates this sequence by applying dynamic programming on each signal. Specifically, for each segment either individual or best joint PDF for compression is considered. Between each two consecutive PDFs, an edge is placed. With each edge, a probability is associated that the best solution switches from the corresponding PDF on the previous segment to the corresponding segment in the current time step. These probabilities can be obtained using statistical techniques. For example, they can be found by considering a training set of the relevant signals. Once the most likely sequence for the minimal cost is found, the technology may employ it on future signals. The segments can be either of uniform or non-uniform size. In the latter case, the length of each segment can be determined by iteratively merging the consecutive short segments.

The technology will now be described with reference to the Figures ("drawings"). In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

FIG. 1 is a block diagram illustrating an environment 100 in which an adaptive compression technology may operate. In various embodiments, environment 100 can include one or more sensors 140 and components 160. Sensors 104a-104n are shown in sensors 140 by way of example and one skilled in the art will appreciate that there may be a different number of sensors in sensors 140. As examples, sensors 104a, 104b, and 104c may receive a patient's EKG signals; sensor 104d may receive the patient's temperature; and sensor 104n may receive data about the patient's blood content. Components 160 can include a data collector 102, a data storage 106, a partition identifier 108, PDFs 110, and an expert system 112. Data collector 102 can collect data from sensors 140. Data storage 106 can store the collected data, such as in a database, hard disk drive, network location, memory location, etc. Partition identifier 108 can identify regions within the collected data. One or more probability distribution functions 110 can be stored as parts of models that provide information that can be used to appropriately compress data, such as information for identifying regions and which compression method to use for each region. Expert system 112 can provide a preliminary diagnosis, such as by analyzing the collected data.

Figure 2:
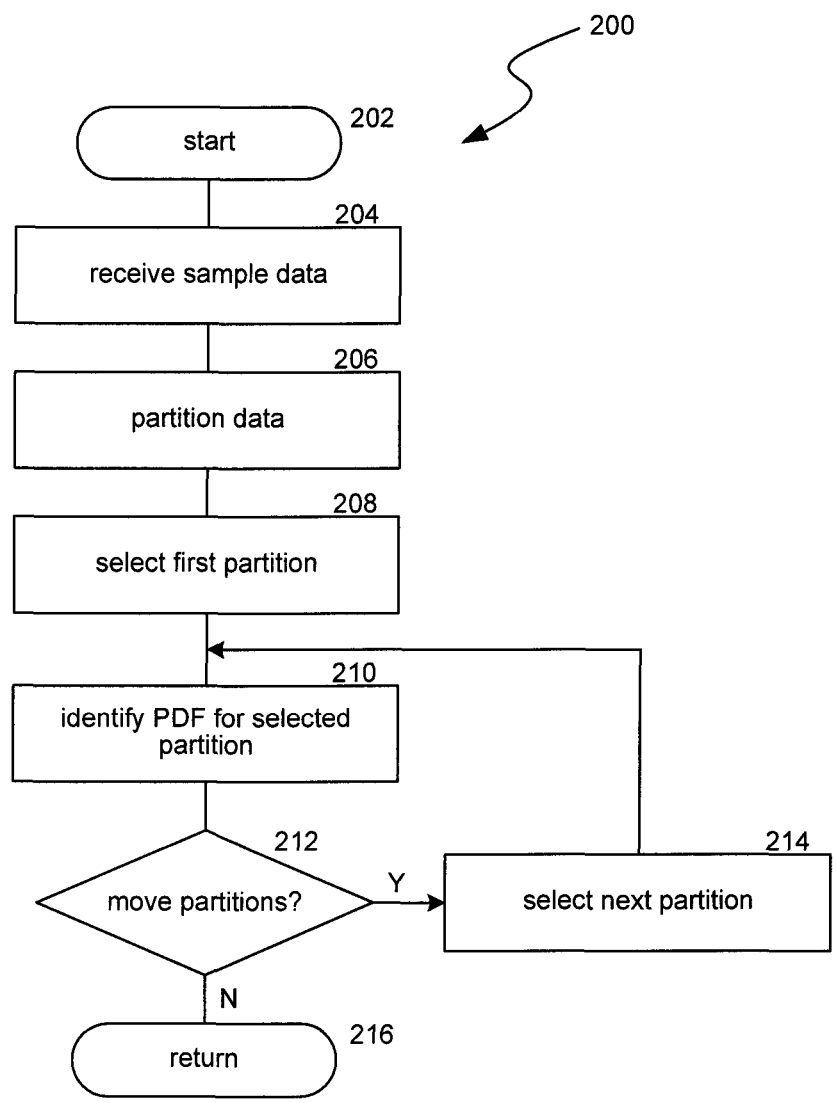
FIG. 2 is a flow diagram illustrating a routine invoked by the adaptive compression technology in some embodiments to partition data and identify probability distribution functions for the partitions.

FIG. 2 is a flow diagram illustrating a routine 200 invoked by the adaptive compression technology in some embodiments to partition data and identify probability distribution functions for the partitions. The routine begins at block 202. At block 204, the routine receives sample data. As an example, the routine receives data from one or more sensors. At block 206, the routine partitions the received data. As an example, the routine determines whether data received at any particular point in time exceeds previously received data by more than a specified threshold value or percentage. When such excursions occur, the routine may identify that particular time as a boundary of a partition so that data received before that particular time are in a first partition and data received after that particular time are in a second partition. At block 208, the routine selects a first partition from an identified set of the partitions. At block 210, the routine identifies a probability distribution function ("PDF") for the selected partition. At decision block 212, the routine determines whether there are any more partitions. If there are more partitions, the routine continues at block 214. Otherwise, the routine returns at block 216. At block 214, the routine selects another partition for which a PDF has not yet been identified. The routine then continues at block 210.

Those skilled in the art will appreciate that the steps shown in FIG. 2 and in each of the flow diagrams discussed herein may be altered in a variety of ways. For example, the order of the logic may be rearranged; substeps may be performed in parallel; shown logic may be omitted, or other logic may be included; etc. One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

Figure 3:
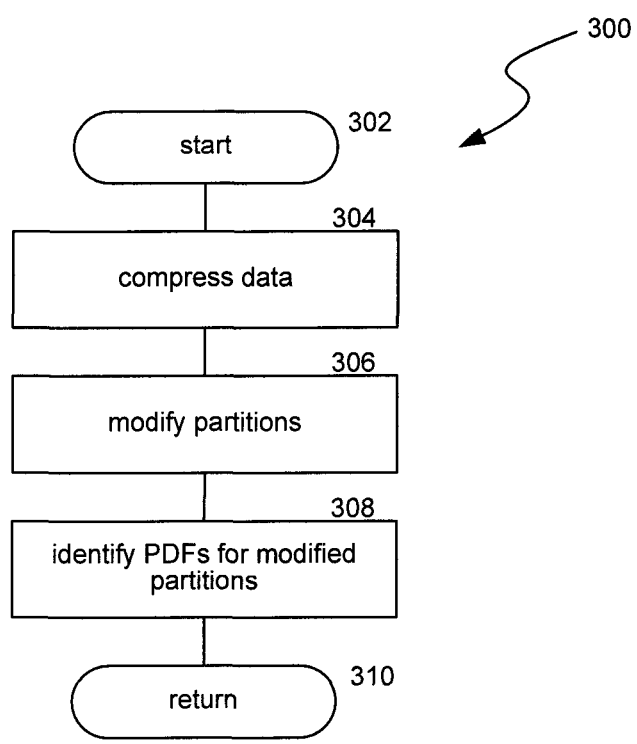
FIG. 3 is a flow diagram illustrating a routine invoked by the adaptive compression technology in some embodiments to compress partitioned data.

FIG. 3 is a flow diagram illustrating a routine 300 invoked by the adaptive compression technology in some embodiments to compress partitioned data. The routine begins at block 302. At block 304, the routine compresses data that it has received. In various embodiments, the routine may employ different compression methods to compress the data, e.g., based on a selected PDF for each partition of the data. At block 306, the routine modifies the partitions. As an example, the routine may employ smoothing techniques or other techniques to change the amount of data that is associated with any given partition. At block 308, the routine identifies PDFs for the modified partitions. At block 310, the routine returns.

Figure 4:
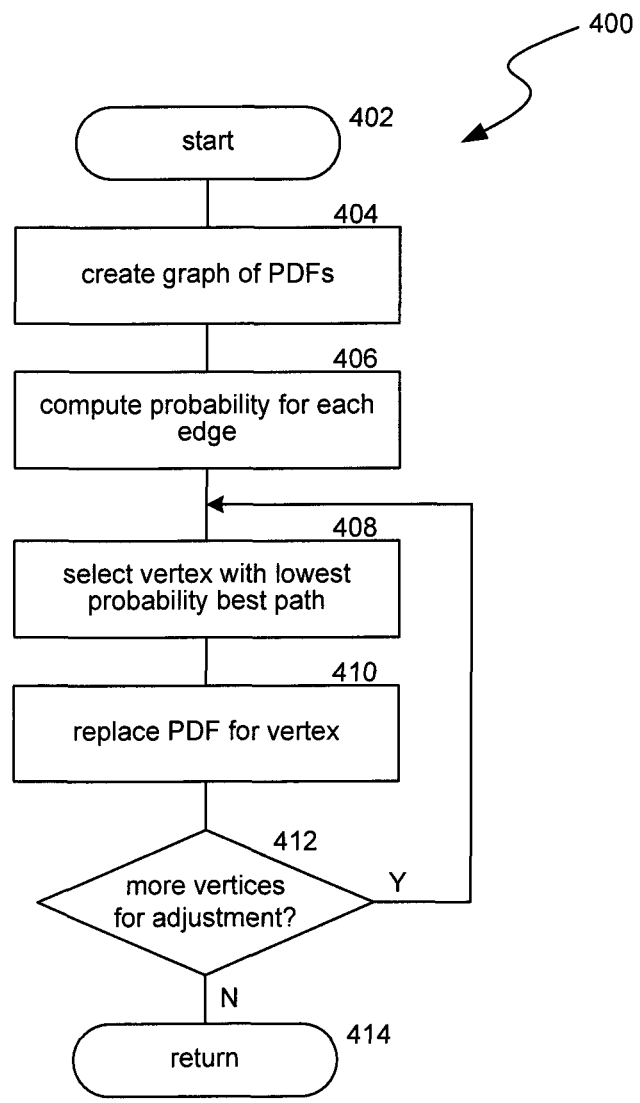
FIG. 4 is a flow diagram illustrating a routine invoked by the adaptive compression technology in some embodiments to optimize compression.
Figure 6:
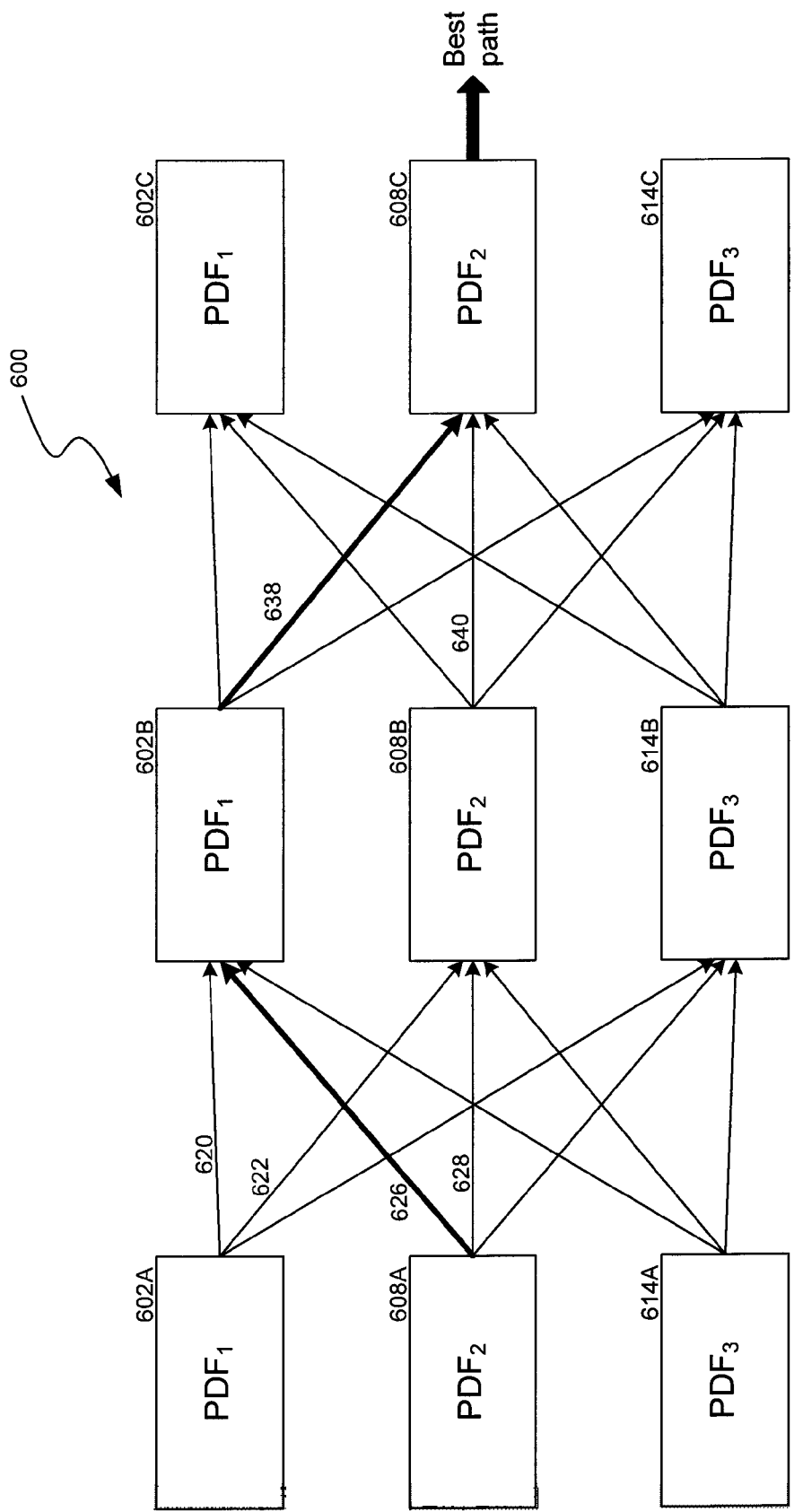
FIG. 6 is a path diagram illustrating paths of probability distribution functions the adaptive compression technology may create and employ in various embodiments.

FIG. 4 is a flow diagram illustrating a routine 400 invoked by the adaptive compression technology in some embodiments to optimize compression. The routine begins at block 402. At block 404, the routine creates a graph of PDFs. A graph is a set of vertices and edges wherein each edge connects two vertices. In the graph the routine 400 creates, each node corresponds to a PDF. An example of such a graph is illustrated in FIG. 6 and further discussed below. At block 406, the routine computes a probability for each edge of the graph. The probability for each edge can correspond to the likelihood of transiting that edge when compressing data. Each vertex may have a best path as described in further detail below in relation to FIG. 6. At block 408, the routine selects a vertex whose best path has the least probability. The best path represents the path that is most likely to be transited when compressing data. At block 410, the routine replaces the PDFs for that vertex with another PDF. By selecting the vertex with the lowest probability best path and replacing the PDF for that vertex, the routine attempts to improve compression. At decision block 412, the routine determines whether there are any more vertices that need adjustment (e.g., replacement of PDF). If so, the routine continues at block 408. Otherwise, the routine returns at block 414.

Figure 5:
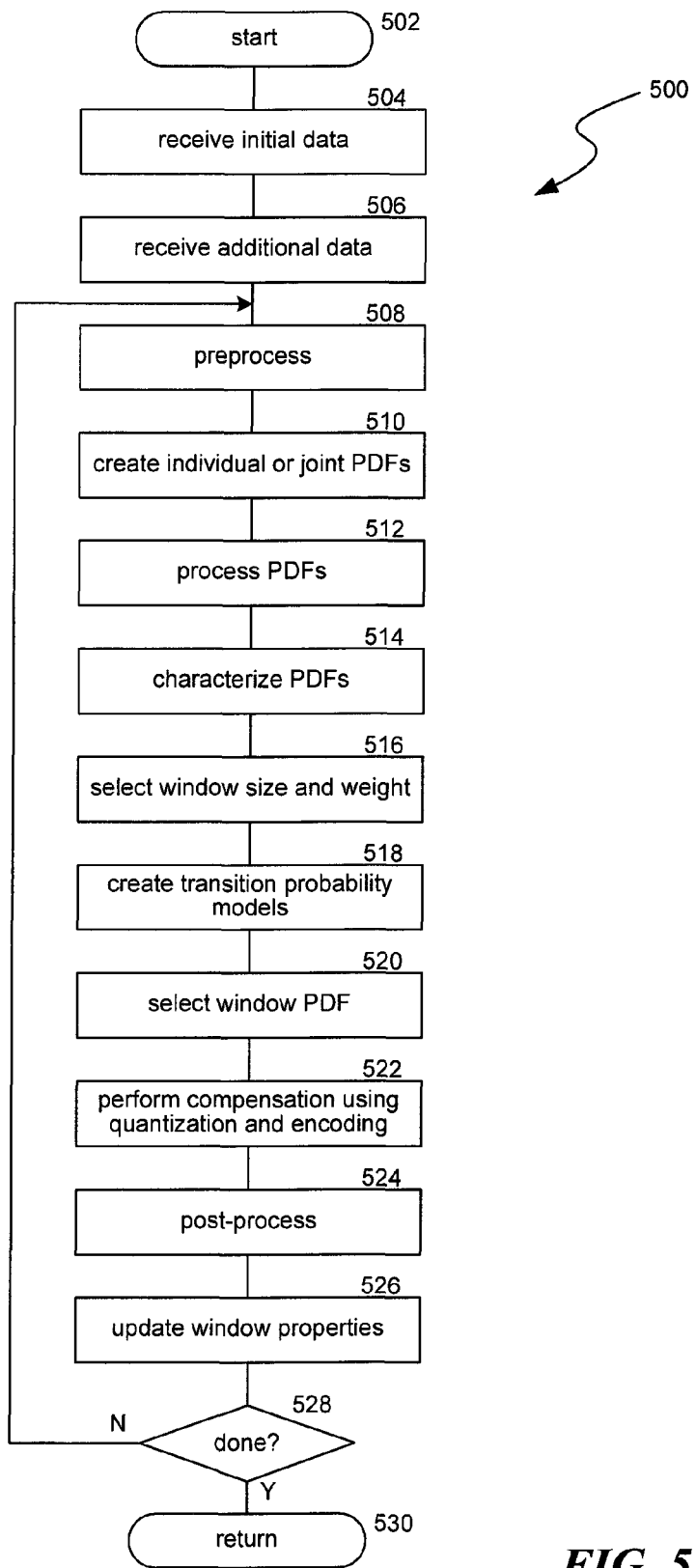
FIG. 5 is a flow diagram illustrating a routine invoked by the adaptive compression technology in some embodiments to compress data.

FIG. 5 is a flow diagram illustrating a routine 500 invoked by the adaptive compression technology in some embodiments to compress data. The routine begins at block 502. At block 504, the routine receives initial data, e.g., data from one or more sensors or from a storage of previously received data. The routine may then partition the data and assign PDFs to each partition as discussed earlier (not illustrated). At block 506, the routine receives additional data. The additional data can be received from sensors, e.g., over a time period after initially identifying PDFs for data partitions. At block 508, the routine pre-processes the data, e.g., to re-identify partitions by changing window sizes. As an example, the routine pre-processes the received initial data and the received additional data. At block 510, the routine creates PDFs for each partition. At block 512, the routine processes the PDFs. At block 514, the routine characterizes the PDFs. At block 516, the routine selects a window size and the weight. At block 518, the routine creates transition probability models. At block 520, the routine selects a window PDF. At block 522, the routine performs compensation using quantization and encoding. At block 524, the routine post-processes the data (e.g., received initial and/or additional data) and their compressed version. The routine may employ traditional compression techniques during post-processing. At block 526, the routine updates window properties. At decision block 528, the routine determines whether or not to stop optimizing. If the routine is to continue optimizing, the routine continues at block 508. Otherwise, the routine returns at block 530.

FIG. 6 is a path diagram illustrating paths of probability distribution functions the adaptive compression technology may create and employ in various embodiments. As depicted, a graph 600 has three PDFs ($PDF_1$, $PDF_2$, and $PDF_3$), and each PDF has three instances: $PDF_1$ has instances 602A, 602B, and 602C; $PDF_2$ has instances 608A, 608B, and 608C; and $PDF_3$ has instances 614A, 614B, and 614C. The graph has vertices from the A instances to the B instances and then from the B instances to the C instances. For example, there is an edge 620 from $PDF_1$ 602A to $PDF_2$ 608B, an edge 622 from $PDF_1$ 602A to $PDF_2$ 608B, an edge 626 from $PDF_2$ 608A to $PDF_1$ 602B, and an edge 628 from $PDF_2$ 608A to $PDF_2$ 608B. Similarly, there is an edge 638 from $PDF_1$ 602B to $PDF_2$ 608C and an edge 640 from $PDF_2$ 608B to $PDF_2$ 608C. Thus, there are several routes from $PDF_2$ 608A to $PDF_2$ 608C. A first route is via edges 628 and 640. A second route is via edges 626 and 638. A probability can be associated with each edge. A best path can be computed as the edges that have the highest probability of being transited. This is illustrated in bold by edges 626 and 638 to indicate that the best path for the illustrated set of vertices and edges is $PDF_2$ 608A via edge 626 to $PDF_1$ 602B and then via edge 638 to $PDF_2$ 608C.

Figure 7:
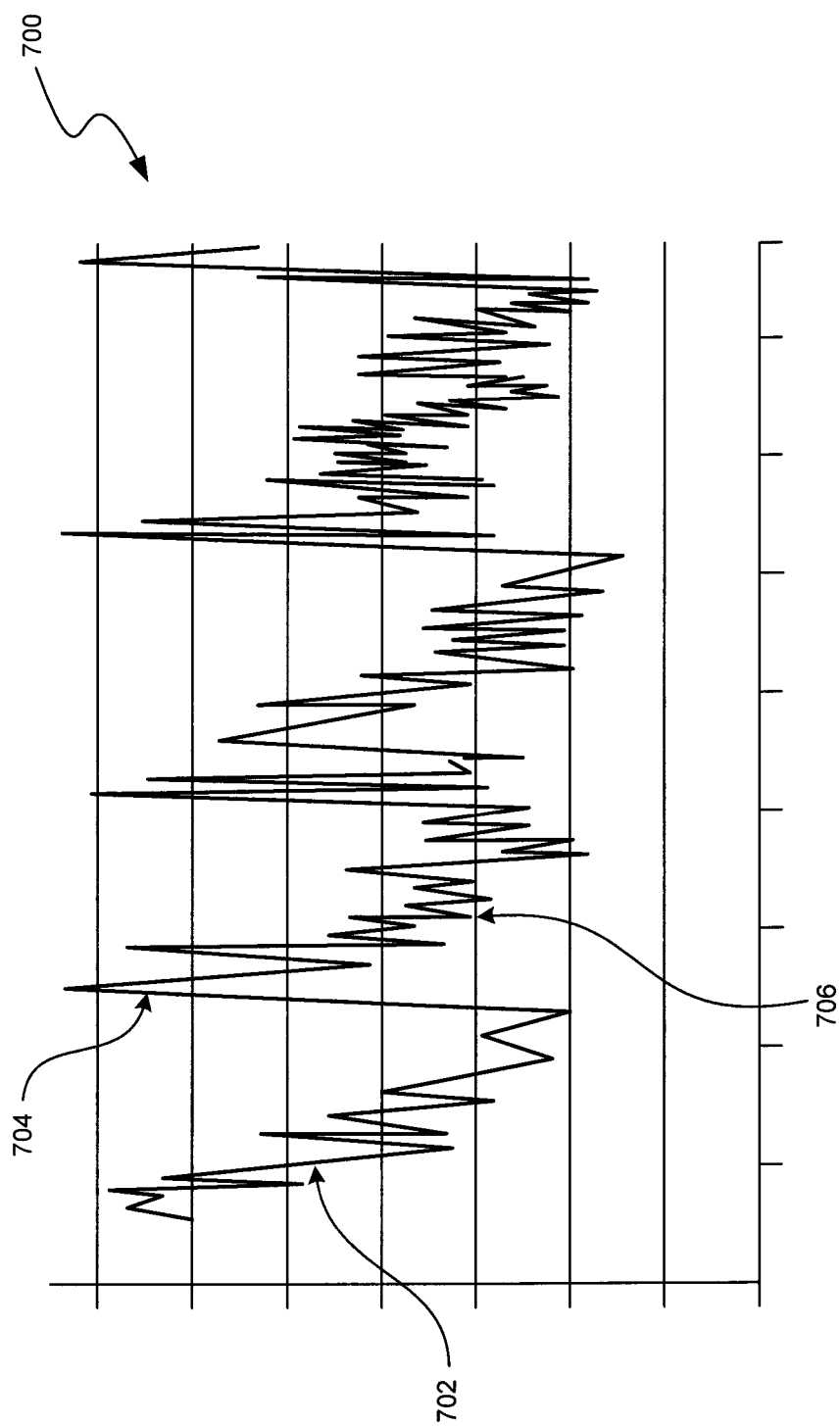
FIG. 7 is a chart illustrating data collected from a sensor in some embodiments.

FIG. 7 is a chart 700 illustrating data collected from a sensor in some embodiments. The chart 700 has regions 702, 704, and 706. Region 702 is marked by rapidly decreasing data values; region 704 is marked by a spiked increase in data values; and region 706 is marked by a slow decrease in data values. Each region can be partitioned by finding points at which changes from decreasing to increasing data values occurs. A different PDF can then be associated with each region.

Figure 8:
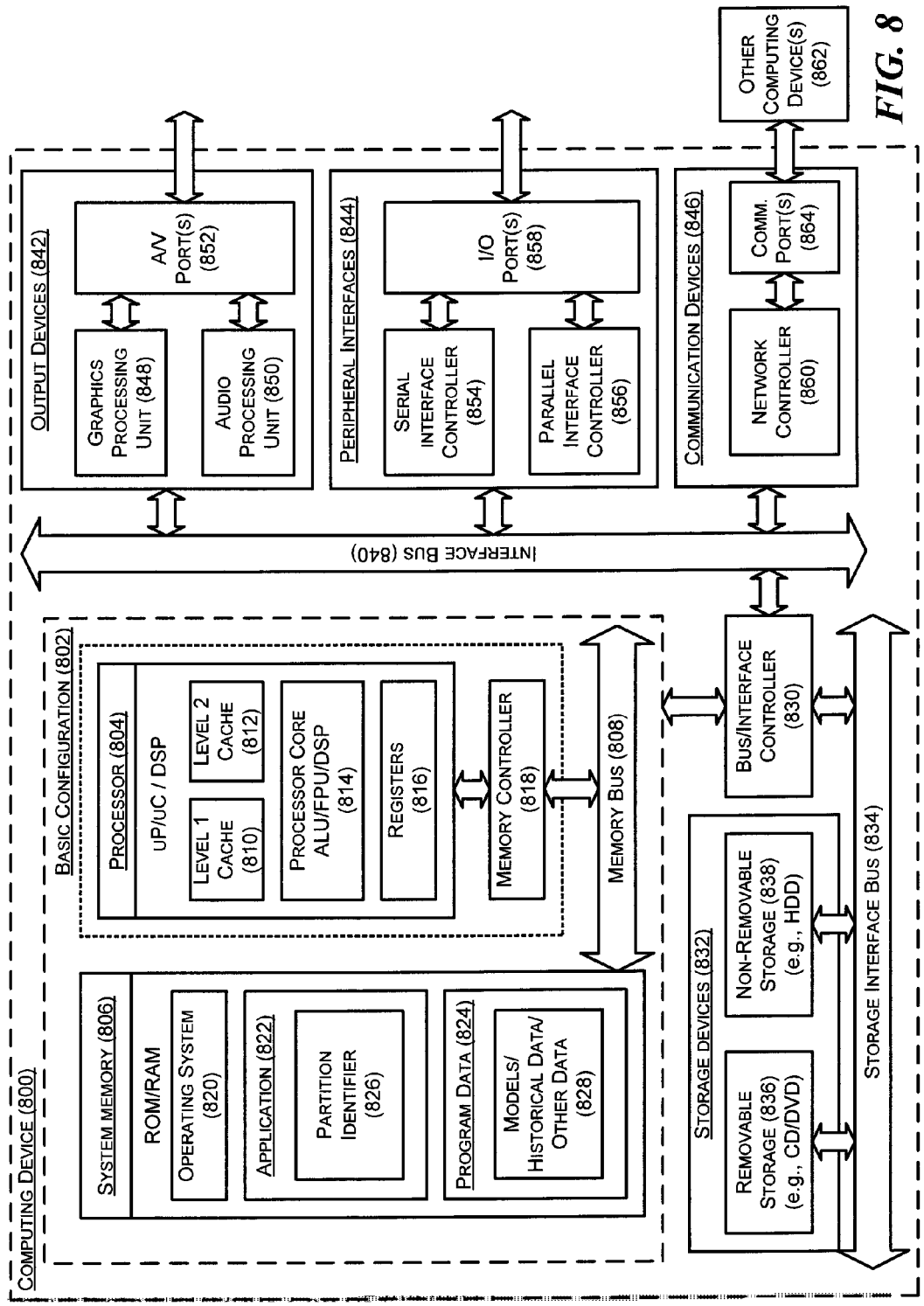
FIG. 8 is a block diagram illustrating an example of a computing device that can be arranged as a suitable computing system for use with the feedback technology in accordance with the present disclosure.

FIG. 8 is a block diagram illustrating an example of a computing device 800 that can be arranged as a suitable computing system for use with the feedback technology in accordance with the present disclosure. In a very basic configuration 802, computing device 800 typically includes one or more processors 804 and a system memory 806. A memory bus 808 may be used for communicating between processor 804 and system memory 806.

Depending on the desired configuration, processor 804 may be of any type including but not limited to a microprocessor (μP), a microcontroller (μC), a digital signal processor (DSP), or any combination thereof. Processor 804 may include one or more levels of caching, such as a level one cache 810 and a level two cache 812, a processor core 814, and registers 816. An example processor core 814 may include an arithmetic logic unit (ALU), a floating point unit (FPU), a digital signal processing core (DSP Core), or any combination thereof. An example memory controller 818 may also be used with processor 804, or in some implementations memory controller 818 may be an internal part of processor 804.

Depending on the desired configuration, system memory 806 may be of any type including but not limited to volatile memory (such as RAM), non-volatile memory (such as ROM, flash memory, etc.) or any combination thereof. System memory 806 may include an operating system 820, one or more applications 822, and program data 824. Application 822 may include one or more components (e.g., a partition identifier 826) that are arranged to generate and maintain models, predict surgical tool movement, compute hazard levels, etc. The software components may employ hardware devices, such as sensors. Program data 824 may include models, historical data, PDFs, and/or other data 828. In some embodiments, application 822 may be arranged to operate with program data 824 on operating system 820. This described basic configuration 802 is illustrated in FIG. 8 by those components within the inner dashed line.

Computing device 800 may have additional features or functionality, and additional interfaces to facilitate communications between basic configuration 802 and any required devices and interfaces. For example, a bus/interface controller 830 may be used to facilitate communications between basic configuration 802 and one or more data storage devices 832 via a storage interface bus 834. Data storage devices 832 may be removable storage devices 836, non-removable storage devices 838, or a combination thereof. Examples of removable storage and non-removable storage devices include magnetic disk devices such as flexible disk drives and hard-disk drives (HDD), optical disk drives such as compact disk (CD) drives or digital versatile disk (DVD) drives, solid state drives (SSD), and tape drives to name a few. Example computer storage media may include volatile and nonvolatile, removable and non-removable media implemented in any method or technology for storage of information, such as computer readable instructions, data structures, program modules, or other data.

System memory 806, removable storage devices 836 and non-removable storage devices 838 are examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which may be used to store the desired information and which may be accessed by computing device 800. Any such computer storage media may be part of computing device 800.

Computing device 800 may also include an interface bus 840 for facilitating communication from various interface devices (e.g., output devices 842, peripheral interfaces 844, and communication devices 846) to basic configuration 802 via bus/interface controller 830. Example output devices 842 include a graphics processing unit 848 and an audio processing unit 850, which may be configured to communicate to various external devices such as a display or speakers via one or more A/V ports 852. Example peripheral interfaces 844 include a serial interface controller 854 or a parallel interface controller 856, which may be configured to communicate with external devices such as input devices (e.g., keyboard, mouse, pen, voice input device, touch input device, etc.) or other peripheral devices (e.g., printer, scanner, etc.) via one or more I/O ports 858. An example communication device 846 includes a network controller 860, which may be arranged to facilitate communications with one or more other computing devices 862 over a network communication link via one or more communication ports 864.

The network communication link may be one example of a communication media. Communication media may typically be embodied by computer readable instructions, data structures, program modules, or other data in a modulated data signal, such as a carrier wave or other transport mechanism, and may include any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), microwave, infrared (IR) and other wireless media. The term computer readable media as used herein may include both storage media and communication media.

Computing device 800 may be implemented as a portion of a small-form factor portable (or mobile) electronic device such as a cell phone, a personal data assistant (PDA), a personal media player device, a wireless web-watch device, a personal headset device, an application specific device, or a hybrid device that include any of the above functions. Computing device 800 may also be implemented as a personal computer including both laptop computer and non-laptop computer configurations.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, systems, or other specific examples or embodiments disclosed herein. It is also to be understood that the terminology used herein is for the purpose of describing particular embodiments only, and is not intended to be limiting.

In an illustrative embodiment, any of the operations, processes, etc. described herein can be implemented as computer-readable instructions stored on a computer-readable medium. The computer-readable instructions can be executed by a processor of a mobile unit, a network element, and/or any other computing device.

There is little distinction left between hardware and software implementations of aspects of systems; the use of hardware or software is generally (but not always, in that in certain contexts the choice between hardware and software can become significant) a design choice representing cost vs. efficiency tradeoffs. There are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; if flexibility is paramount, the implementer may opt for a mainly software implementation; or, yet again alternatively, the implementer may opt for some combination of hardware, software, and/or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a CD, a DVD, a digital tape, a computer memory, etc.; and a transmission type medium such as a digital and/or an analog communication medium (e.g., a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely examples, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art, all language such as "up to," "at least," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

The invention claimed is:

1. A method performed by a computing system for compressing data, comprising:
   identifying two or more partitions of a data stream;
   optionally pre-processing data in each partition;
   creating one or more evaluation functions to evaluate a suitability for compression of the data in each partition using a set of potential compression methods;
   processing the created one or more evaluation functions;
   choosing a subset of the set of potential compression methods for each partition at least partly by analyzing the evaluation functions;
   selecting using a dynamic programming technique a compression method for each partition based at least on a compression rate of the data in the partition;
   compressing the data in each partition using the selected compression method for the partition, thereby creating a sequence of compression methods wherein each member of the sequence indicates a compression method used to compress a corresponding partition; and
   compressing a subsequence of the sequence of compression methods.

2. The method of claim 1 wherein the identifying includes setting all partitions to have an equal length.

3. The method of claim 2 wherein the length is set using a binary search for a highest compression ratio.

4. The method of claim 1 wherein the optionally pre-processing includes using delta modeling, transformation in other domain using linear transformation, or application of any other compression method.

5. The method of claim 1 further comprising characterizing selected subsets based on their suitability for high rate compression is performed using probability distribution functions (PDFs) of single or multiple consecutive characters.

6. The method of claim 5 wherein a function for evaluating suitability for compression of data in each partition is at least one of an entropy, a mutual entropy, a PDF monotonicity, or a moving average of autocorrelation.

7. The method of claim 1 wherein processing the created one or more evaluation functions includes employing parametric or nonparametric statistical techniques such as smoothing or regression.

8. The method of claim 1 wherein processing the created one or more evaluation functions is conducted using re-sampling or boosting statistical techniques, or other machine learning technique.

9. The method of claim 1 wherein choosing compression methods includes identifying compression techniques that had a highest score according to processed evaluation functions.

10. The method of claim 1 wherein selecting the compression method for each partition is performed using dynamic programming to minimize the overall compression rate.

11. The method of claim 1 wherein compression of each partition is conducted using a compression method such as run-length encoding, dictionary coders, entropy encoding, arithmetic coding, discrete cosine transform, wavelet compression, linear predictive coding or a compression method that employs statistically processed prediction models.

12. The method of claim 1 wherein compression of each partition is conducted using a lossless compression method such as run-length encoding, dictionary coders, entropy encoding, arithmetic coding, or universal codes.

13. The method of claim 1 wherein the data is compressed on-line with at most a specified latency, and prediction models are used to predict a most likely most beneficial or average most beneficial compression technique for each partition.

14. The method of claim 13 wherein dynamic programming is used with latency L to calculate a most beneficial selection of a compression method for a specified number of partitions that are completed at most L time units earlier.

15. The method from claim 1 wherein information from a global positioning system, some other location discovery system, a clock, a speedometer, or some other type of sensor is used to adaptively select a compression technique for a selected partition.

16. A computer-readable storage medium storing computer-executable instructions that, when executed, perform a method for compressing multiple streams of data, comprising:
   identifying two or more partitions of each of two or more signals;
   optionally pre-processing one or more signals to make it more suitable for high rate of compression;
   creating one or more evaluation functions to evaluate a suitability for compression of the data in each partition using a set of potential compression methods wherein some of the functions are defined over two or more signals;
   processing the created evaluation functions;
   choosing a subset of the set of potential compression methods for each partition of each signal at least partly by analyzing the evaluation functions;

selecting a compression method for each partition of each signal based at least on a compression rate of the data in the partition;

compressing the data in each partition of all signals using the selected compression method, thereby creating a sequence of compression methods wherein each member of the sequence indicates a compression method used to compress a corresponding partition; and compressing a subsequence of the sequence of compression methods.

17. The computer-readable storage medium of claim 16 wherein the partitions have constant lengths for different signals.

18. The computer-readable storage medium of claim 16 wherein the length of partitions have a small least common multiplier.

19. The computer-readable storage medium of claim 16 further comprising pre-processing wherein different signals are mutually time shifted relative to each other.

20. The computer-readable storage medium of claim 16 wherein selecting a compression method for each partition of each signal includes employing joint PDFs information.

21. The computer-readable storage medium of claim 16 wherein the compression is performed using linear combinations of the considered signals.

22. The computer-readable storage medium of claim 16 wherein the partitions have different lengths for different signals.

23. A system for compressing data, comprising:

a component configured to identify two or more partitions of a data stream;

a component configured to optionally pre-process data in each partition;

a component configured to create one or more evaluation functions to evaluate a suitability for compression of the data in each partition using a set of potential compression methods;

a component configured to process the created one or more evaluation functions;

a component configured to choose a subset of the set of potential compression methods for each partition at least partly by analyzing the evaluation functions;

a component configured to select a compression method for each partition based on a compression ratio of compressing a sequence of compression methods used to compress the data in a corresponding partition and a compression rate of the data in the corresponding partition;

a component configured to compress the data in each partition using the selected compression method for the partition; and a component configured to compress a subsequence of the sequence of compression methods.

* * * * *

UNITED STATES PATENT AND TRADEMARK OFFICE
CERTIFICATE OF CORRECTION

PATENT NO. : 8,427,346 B2
APPLICATION NO. : 12/996972
DATED : April 23, 2013
INVENTOR(S) : Potkonjak It is certified that error appears in the above-identified patent and that said Letters Patent is hereby corrected as shown below:

On Title Page 2, Item (56), under "OTHER PUBLICATIONS", in Column 1, Line 12, delete "PCT/US20101030954" and insert -- PCT/US2010/030954 --, therefor.

On Title Page 2, Item (56), under "OTHER PUBLICATIONS", in Column 2, Line 1, delete "al," and insert -- al., --, therefor.

On Title Page 2, Item (56), under "OTHER PUBLICATIONS", in Column 2, Line 20, delete "Acm" and insert -- ACM --, therefor.

On Title Page 2, Item (56), under "OTHER PUBLICATIONS", in Column 2, Line 34, delete "o•wireless" and insert -- of wireless --, therefor.

On Title Page 3, Item (56), under "OTHER PUBLICATIONS", in Column 2, Line 1, delete "al," and insert -- al., --, therefor.

On Title Page 3, Item (56), under "OTHER PUBLICATIONS", in Column 2, Line 5, delete "Acm," and insert -- ACM, --, therefor.

In the Drawings

Delete drawing sheet 8 of 9, and replace with drawing sheet 8. (Attached)

In the Specification

In Column 3, Line 45, delete "patent's" and insert -- patient's --, therefor.

In Column 5, Line 66, delete "overfilled" and insert -- overfitted --, therefor.

Signed and Sealed this
Third Day of September, 2013

Teresa Stanek Rea
*Acting Director of the United States Patent and Trademark Office*

CERTIFICATE OF CORRECTION (continued)
U.S. Pat. No. 8,427,346 B2

In Column 6, Line 59, delete "multivariate adaptive regression (MARS)," and insert -- multivariate adaptive regression splines (MARS), --, therefor.

In Column 15, Line 24, delete "and or" and insert -- and/or --, therefor.

In the Claims:

In Column 18, Line 46, in Claim 15, delete "from claim" and insert -- of claim --, therefor.